(12) United States Patent
Ko

(10) Patent No.: US 9,184,766 B1
(45) Date of Patent: Nov. 10, 2015

(54) DECODING CIRCUIT

(71) Applicant: SK hynix Inc., Icheon (KR)

(72) Inventor: Jae Bum Ko, Suwon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/632,268

(22) Filed: Feb. 26, 2015

(30) Foreign Application Priority Data

Dec. 24, 2014 (KR) .......................... 10-2014-0188624

(51) Int. Cl.
| | |
|---|---|
| H03M 7/00 | (2006.01) |
| H03M 5/14 | (2006.01) |
| H03K 19/20 | (2006.01) |
| G11C 8/10 | (2006.01) |

(52) U.S. Cl.
CPC ................. *H03M 5/145* (2013.01); *G11C 8/10* (2013.01); *H03K 19/20* (2013.01)

(58) Field of Classification Search
CPC ...... G11C 8/10; G11B 20/1426; H03M 5/145; H03M 19/20; H04L 25/4908
USPC ............................................. 341/95; 326/105
See application file for complete search history.

(56) References Cited

U.S. PATENT DOCUMENTS

| | | | | |
|---|---|---|---|---|
| 4,143,359 A | * | 3/1979 | Beelitz ..................... | G11C 8/10 340/14.64 |
| 6,456,118 B2 | * | 9/2002 | Beat ..................... | G11C 11/418 326/105 |
| 7,557,617 B1 | * | 7/2009 | Leung ..................... | G11C 8/10 326/105 |
| 8,774,324 B2 | | 7/2014 | Dick | |
| 8,862,854 B2 | * | 10/2014 | Vaidyanathan .... | H03K 19/1732 711/200 |

FOREIGN PATENT DOCUMENTS

KR  10-2003-0070656 A   9/2003

* cited by examiner

*Primary Examiner* — Khai M Nguyen

(57) ABSTRACT

A decoding circuit is disclosed, which relates to a technology for changing a decoding structure without changing a circuit structure. A decoding circuit for decoding N input signals to generate output signals corresponding to elements of $2^N$ binary information includes: a controller configured to generate control signals; a decoding unit configured to generate output signals by decoding the N input signals, wherein the number of output signals is controlled in response to the control signals; and a combination unit configured to output a first output signal by logically combining the output signals of the decoding unit.

20 Claims, 5 Drawing Sheets

DECODING CIRCUIT

CROSS-REFERENCE TO RELATED APPLICATION

This application claims priority to Korean Patent Application No. 10-2014-0188624, filed on Dec. 24, 2014, the disclosure of which is hereby incorporated in its entirety by reference.

BACKGROUND

Embodiments of the present disclosure relate to a decoding circuit, and more particularly to a technology for changing a decoding structure without changing a circuit structure.

In a semiconductor circuit configured to process digital data, certain data is represented by a binary code. The binary code composed of N bits may represent a maximum of $2^N$ coded information elements. A decoding circuit is a combination circuit configured to convert binary information in such a manner that N coded input data signals are converted into a maximum of $2^N$ decoded output data signals, wherein N is a positive integer.

In addition, a coded address is used to select a specific cell from a semiconductor memory device. Therefore, when data is recorded in a specific cell of the semiconductor memory device or data is read from the specific cell, an address decoding process is needed. To perform the address decoding process, the semiconductor memory device generally includes a row decoder and a column decoder.

For example, it is assumed that there is a decoding circuit for outputting 8 output signals OUT<7:0> by decoding 3 input signals IN<2:0>.

If an input signal IN is set to "000," the decoding circuit outputs the output signal OUT as "00000001." If the input signal IN is set to "001," the decoding circuit outputs the output signal OUT as "00000010." If the input signal IN is set to "010," the decoding circuit outputs the output signal OUT as "00000100." In addition, if the input signal IN is set to "011," the decoding circuit outputs the output signal OUT as "00001000."

If the input signal IN is set to "100," the decoding circuit outputs the output signal OUT as "00010000." If the input signal IN is set to "101," the decoding circuit outputs the output signal OUT as "00100000." If the input signal IN is set to "110," the decoding circuit outputs the output signal OUT as "01000000." If the input signal IN is set to "111," the decoding circuit outputs the output signal OUT as "10000000."

When the decoding circuit is configured to output 8 output signals by decoding 3 input signals, the decoding circuit generates binary information of the output signal OUT mandatorily including a code "1."

Subsequently, it is assumed that there is a decoding circuit that outputs 6 output signals OUT<5:0> by decoding 3 input signals IN<2:0>.

If the input signal IN is set to "000," the decoding circuit outputs the output signal OUT as "00000001." If the input signal IN is set to "001," the decoding circuit outputs the output signal OUT as "00000010." If the input signal IN is set to "010," the decoding circuit outputs the output signal OUT as "00000100." If the input signal IN is set to "011," the decoding circuit outputs the output signal OUT as "00001000."

If the input signal IN is set to "100," the decoding circuit outputs the output signal OUT as "00010000." If the input signal IN is set to "101," the decoding circuit outputs the output signal OUT as "00100000."

If the input signal IN is set to "110," the decoding circuit outputs the output signal OUT as "00000000," resulting in implementation of a "Don't care" state. If the input signal IN is set to "111," the decoding circuit outputs the output signal OUT as "00000000," resulting in implementation of a "Don't care" state.

The "Don't care" state in which binary information of the output signal OUT does not include the code "1" may occur in the decoding circuit configured to output 6 output signals by decoding 3 input signals.

As described above, if the number of bits of the output signal OUT is changed, there is a need to change a circuit structure of the decoding circuit. However, after the circuit structure of the decoding circuit is decided, it is difficult to change the circuit structure of the decoding circuit. In addition, if the number of bits of the output signal OUT is increased, the decoding circuit is unavoidably increased in size.

BRIEF SUMMARY OF THE INVENTION

Various embodiments of the present disclosure are directed to a decoding circuit that substantially obviates one or more problems due to limitations or disadvantages of the related art.

Embodiments of the present disclosure relate to a technology for reducing the size of a decoding circuit and easily changing a decoding structure of the decoding circuit without changing a circuit structure.

In accordance with an embodiment of the present disclosure, a decoding circuit comprises: a controller configured to generate control signals; a decoding unit configured to generate output signals corresponding to elements of $2^N$ binary information by decoding N input signals, N being a positive integer, wherein the number of output signals is controlled in response to the control signals; and a combination unit configured to output a first output signal by combining the output signals of the decoding unit, wherein the decoding circuit outputs, as decoded output signals, the first output signal of the combination unit and the output signals of the decoding unit.

It is to be understood that both the foregoing general description and the following detailed description of embodiments are not limiting, but are intended to provide further explanation of the invention as claimed.

BRIEF DESCRIPTION OF THE DRAWINGS

The above and other features and advantages of the subject matter of the present disclosure will be readily apparent from the following detailed description taken in conjunction with the accompanying drawings, wherein.

DESCRIPTION OF EMBODIMENTS

Reference will now be made in detail to embodiments of the present disclosure, examples of which are illustrated in the accompanying drawings. Wherever possible, the same reference numbers are used throughout the drawings to refer to the same or like portions. In the following description of the present disclosure, a detailed description of well-known configurations or functions incorporated herein may be omitted for clarity of the subject matter of the present disclosure.

Embodiments of the present disclosure may be applied to a decoding circuit representing data as a binary code. The decoding circuit is a combination circuit configured to convert N coded input signals into a maximum of $2^N$ information elements, N being a positive integer.

Figure 1:
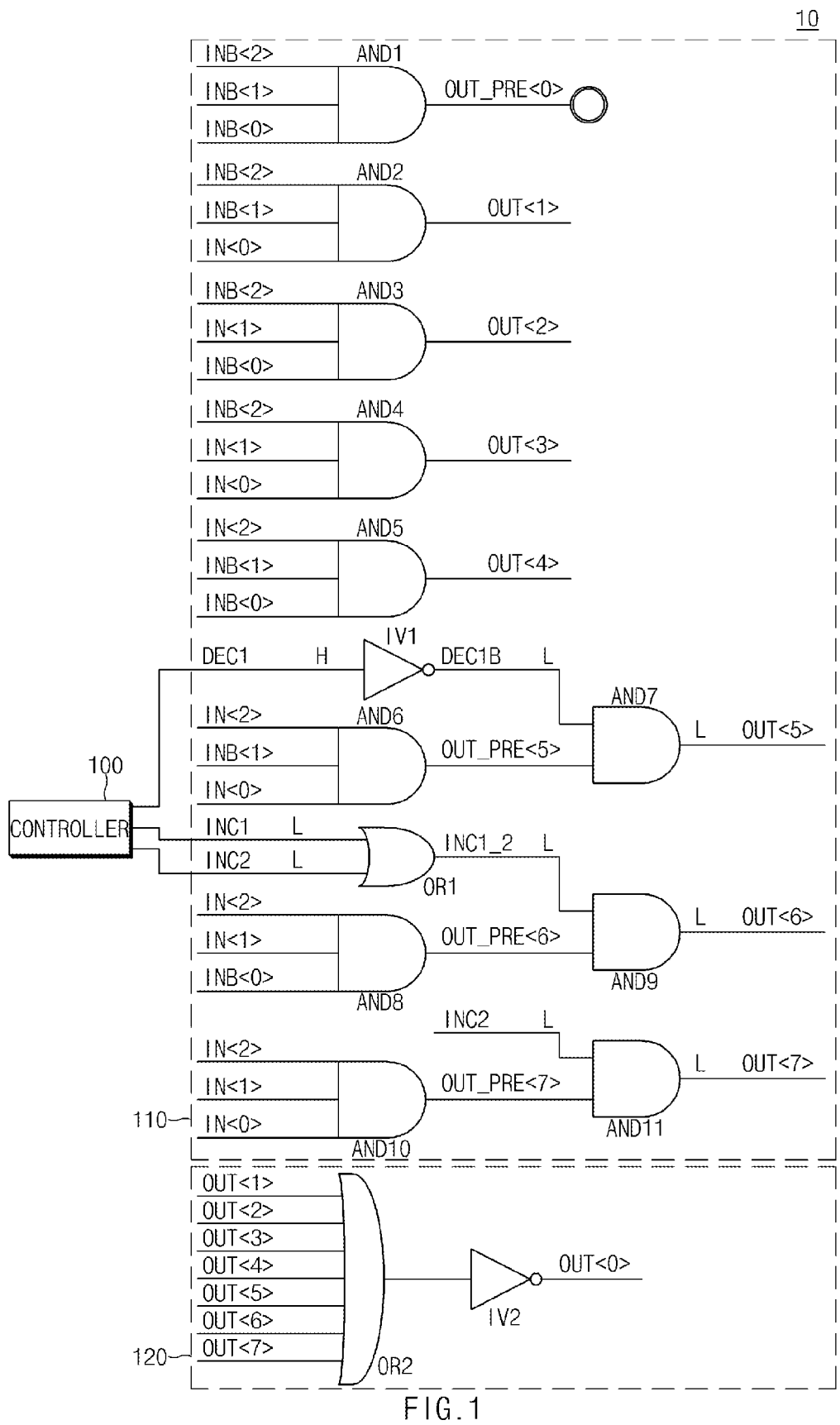
FIG. 1 is a circuit diagram illustrating a decoding circuit according to an embodiment of the present disclosure.

FIG. 1 is a circuit diagram illustrating a decoding circuit 10 according to an embodiment of the present disclosure.

The decoding circuit 10 shown in FIG. 1 can be applied to the case in which a 3-6 decoding circuit is converted into a 3-5 decoding circuit. That is, the number of valid output signals of the decoding circuit 10 is reduced from 6 to 5.

In FIG. 1, the decoding circuit 10 includes a basic circuit structure configured to output 8 output signals OUT<7:0> by decoding 3 input signals IN<2:0>.

The decoding circuit 10 includes a controller 100, a decoding unit 110, and a combination unit 120.

The controller 100 may generate control signals, e.g., a decrease signal DEC1 and increase signals INC1 and INC2, to change the number of valid output signals in response to a decoding control signal from a user. The controller 100 may separately control a logic level of the decrease signal DEC1 and logic levels of the increase signals INC1 and INC2 either using a test mode signal or through fuse cutting. In an embodiment, the fuse cutting may be controlled by a fuse-cutting signal. In an embodiment, the decrease signal DEC1 is used to reduce the number of valid output signals, the first increase signal INC1 is used to increase the number of valid output signals by one, and the second increase signal INC2 is used to increase the number of valid output signals by two. When the decrease signal DEC1 and the increase signals INC1 and INC2 are deactivated, i.e., at a low level, the decoding circuit 10 operates as the 3-6 decoding circuit.

The embodiment of FIG. 1 shows that the control signals generated from the controller 100 include one decrease signal DEC1 and two increase signals INC1 and INC2. However, the scope or spirit of the present disclosure is not limited thereto, and the number of control signals may be changed by a design of the decoding circuit 10.

In this embodiment, if the 3-6 decoding circuit is converted into the 3-5 decoding circuit, the number of valid output signals of the decoding circuit 10 is reduced from 6 to 5. For this purpose, the controller 100 may activate the decrease signal DEC1, and may deactivate the increase signals, INC1 and INC2.

The decoding unit 110 may include a plurality of AND gates AND1~AND11, an OR gate OR1, and an inverter IV1. The AND gates AND1~AND5 may generate output signals OUT<4:1> of a first group. The AND gates AND6~AND11, the OR gate OR1, and the inverter IV1 may correspond to a logic combination unit configured to generate output signals OUT<7:5> of a second group.

The AND gate AND1 may perform a logic AND operation on the input signals INB<2>, INB<1>, and INB<0>, and output an output signal OUT_PRE<0>. The input signal INB is an inversion signal of the input signal IN. In this embodiment of the present disclosure, the output signal OUT_PRE<0> is not used and is at a floating state.

The AND gate AND2 performs an AND operation on the input signals INB<2>, INB<1>, and IN<0>, and outputs the output signal OUT<1>. The AND gate AND3 performs an AND operation on the input signals INB<2>, IN<1>, and INB<0>, and outputs the output signal OUT<2>. The AND gate AND4 performs an AND operation on the input signals INB<2>, IN<1>, and IN<0>, and outputs the output signal OUT<3>. The AND gate AND5 performs an AND operation on the input signals IN<2>, INB<1>, and INB<0>, and outputs the output signal OUT<4>.

In addition, the AND gate AND6 performs an AND operation on the input signals IN<2>, INB<1>, and IN<0>, and outputs an output signal OUT_PRE<5>. The inverter IV1 may output a decrease signal DEC1B by inverting the decrease signal DEC1. The AND gate AND7 performs an AND operation on the output signal OUT_PRE<5> and the decrease signal DEC1B, and outputs the output signal OUT<5>.

The AND gate AND8 performs an AND operation on the input signals IN<2>, IN<1>, and INB<0>, and outputs an output signal OUT_PRE<6>. The OR gate OR1 performs an OR operation on the increase signals INC1 and INC2, and outputs an increase signal INC1_2. The AND gate AND9 performs an AND operation on the output signal OUT_PRE<6> and the increase signal INC1_2, and outputs the output signal OUT<6>.

The AND gate AND10 performs an AND operation on the input signals IN<2>, IN<1>, and IN<0>, and outputs an output signal OUT_PRE<7>. The AND gate AND11 performs an AND operation on the increase signal INC2 and the output signal OUT_PRE<7>, and outputs the output signal OUT<7>.

If the decrease signal DEC1 is activated to a high level and input to the decoding unit 110, the decrease signal DEC1B is output at a low level. As a result, the output signal OUT<5> of the AND gate AND7 is fixed to a low level regardless of logic levels of the input signals IN<2>, IN<1>, and IN<0>.

If the increase signals INC1 and INC2 are deactivated to a low level and input to the decoding unit 110, the increase signal INC1_2 is output at a low level. As a result, the output signal OUT<6> of the AND gate AND9 is fixed to a low level regardless of the logic levels of the input signals IN<2>, IN<1>, and IN<0>. If the increase signal INC2 is deactivated to a low level and input to the decoding unit 110, the output signal OUT<7> of the AND gate AND11 is fixed to a low level regardless of the logic levels of the input signals IN<2>, IN<1>, and IN<0>.

The combination unit 120 may output a single output signal OUT<0> by combining the output signals OUT<7:1> from the decoding unit 110. The combination unit 120 may include an OR gate OR2 and an inverter IV2.

The OR gate OR2 may perform an OR operation on the output signals OUT<7:1>. That is, if at least one of the output signals OUT<7:1> is at a high level and input to the OR gate OR2, the OR gate OR2 outputs a high-level signal. The inverter IV2 outputs the output signal OUT<0> by inverting an output signal of the OR gate OR2.

The logic states of a decoding circuit that generates 8 output signals OUT<7:0> by decoding 3 input signals IN<2:0> are shown in the following Table 1.

TABLE 1

| IN | | | OUT | | | | | | | Function |
|---|---|---|---|---|---|---|---|---|---|---|
| 2 | 1 | 0 | 7 | 6 | 5 | 4 | 3 | 2 | 1 | 0 | |
| 0 | 0 | 0 | 0 | 0 | 0 | 0 | 0 | 0 | 0 | 1 | A |
| 0 | 0 | 1 | 0 | 0 | 0 | 0 | 0 | 0 | 1 | 0 | B |
| 0 | 1 | 0 | 0 | 0 | 0 | 0 | 0 | 1 | 0 | 0 | C |
| 0 | 1 | 1 | 0 | 0 | 0 | 0 | 1 | 0 | 0 | 0 | D |
| 1 | 0 | 0 | 0 | 0 | 0 | 1 | 0 | 0 | 0 | 0 | E |
| 1 | 0 | 1 | 0 | 0 | 1 | 0 | 0 | 0 | 0 | 0 | A |

TABLE 1-continued

| IN | | | OUT | | | | | | | | Function |
|---|---|---|---|---|---|---|---|---|---|---|---|
| 1 | 1 | 0 | 0 | 1 | 0 | 0 | 0 | 0 | 0 | 0 | A |
| 1 | 1 | 1 | 1 | 0 | 0 | 0 | 0 | 0 | 0 | 0 | A |

As can be seen from Table 1, if the 3-6 decoding circuit is converted into the 3-5 decoding circuit, the decoding circuit 10 outputs only 5 (i.e., $2^N-3$) valid output signals OUT.

In this embodiment, if the input signals IN<2:0> are set to "101," "110," and "111" and input to the decoding unit 110, the input signals IN<2:0> are deactivated. For this purpose, the decrease signal DEC1 is activated, and the increase signals INC1 and INC2 are deactivated. As a result, if the input signals IN<2:0> are set to "101," "110," and "111" and input to the decoding unit 110, the output signals OUT<7:5> of the AND gates AND7, AND9, and AND11 are fixed to a low level That is, the output signals OUT<7:5> (i.e., output signals of the second group) of the decoding unit 110 are at a low level. If any one of the output signals OUT<4:1> (i.e., output signals of the first group) is at a high level, the combination unit 120 outputs the output signal OUT<0> at a low level. In this embodiment, it is assumed that any one of the output signals OUT<4:0> is activated to a high level.

That is, a logic level of the output signal OUT<0> is determined by a level of the output signal OUT<4:1>. Therefore, the decoding unit 110 outputs 5 valid output signals OUT<4:0> in response to 3 input signals IN<2:0>.

Figure 2:
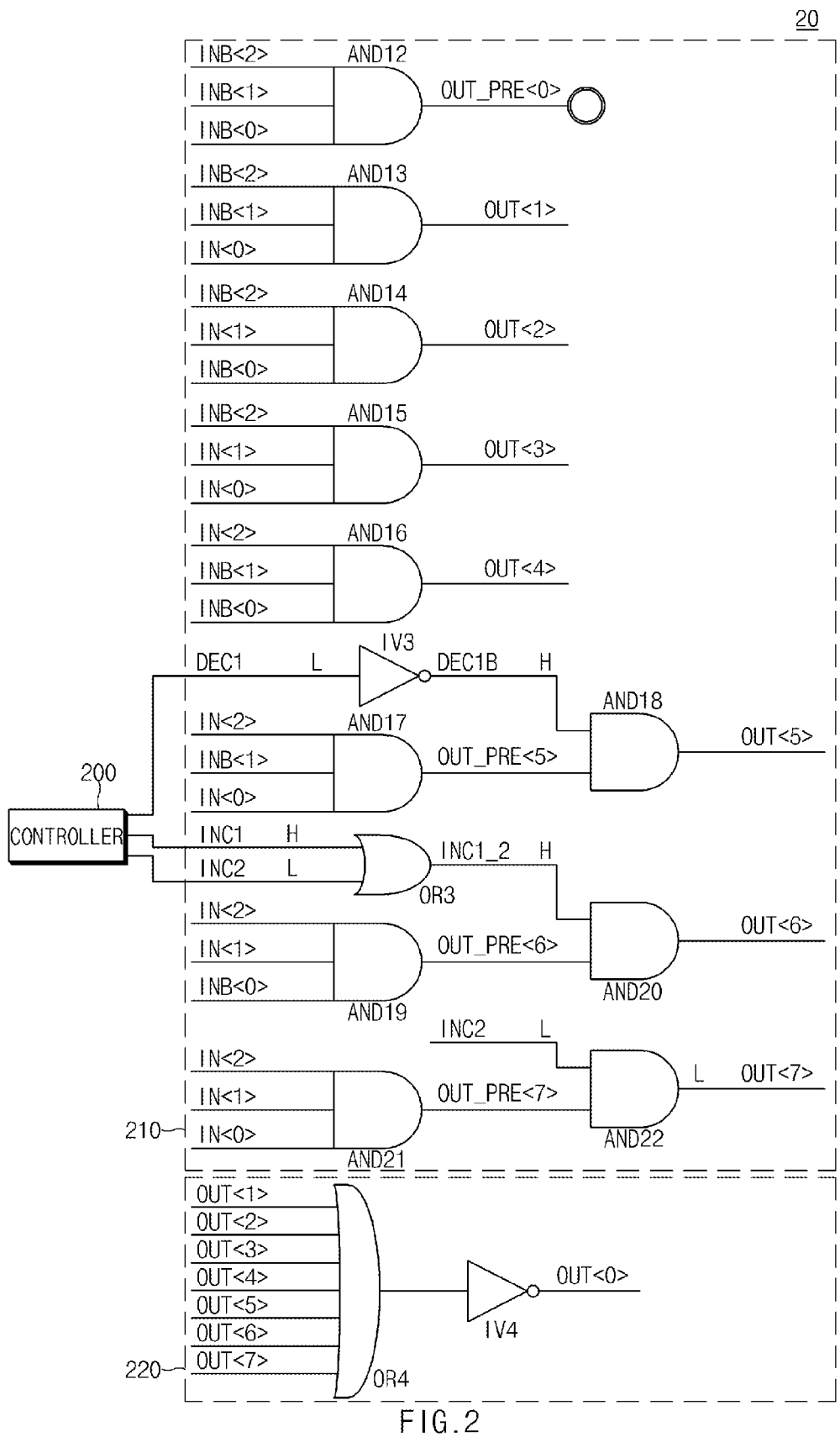
FIG. 2 is a circuit diagram illustrating a decoding circuit according to another embodiment of the present disclosure.

FIG. 2 is a circuit diagram illustrating a decoding circuit 20 according to another embodiment of the present disclosure.

The decoding circuit 20 shown in FIG. 2 can be applied to the case in which a 3-6 decoding circuit is converted into a 3-7 decoding circuit. That is, the number of valid output signals of the decoding circuit 20 is increased from 6 to 7.

In FIG. 2, the decoding circuit 20 includes a basic circuit structure configured to output 8 output signals OUT<7:0> by decoding 3 input signals IN<2:0>.

The decoding circuit 20 includes a controller 200, a decoding unit 210, and a combination unit 220.

The controller 200 may generate a decrease signal DEC1 and increase signals INC1 and INC2 in response to a decoding control signal from a user. The controller 200 may separately control a logic level of the decrease signal DEC1 and logic levels of the increase signals INC1 and INC2 either using a test mode signal or through fuse cutting. When the decrease signal DEC1 and the increase signals INC1 and INC2 are deactivated, i.e., at a low level, the decoding circuit 20 operates as the 3-6 decoding circuit.

In this embodiment, if the 3-6 decoding circuit is converted into the 3-7 decoding circuit, the number of valid output signals of the decoding circuit 20 is increased from 6 to 7. For this purpose, the controller 200 may deactivate the decrease signal DEC1 and the increase signal INC2, and may activate the increase signal INC1 to increase the number of valid output signals by one.

The decoding unit 210 may include a plurality of AND gates AND12~AND22, an OR gate OR3, and an inverter IV3. The AND gates AND12~AND16 may generate output signals OUT<4:1> of a first group. The AND gates AND17~AND22, the OR gate OR3, and the inverter IV3 may correspond to a logic combination unit configured to generate output signals OUT<7:5> of a second group.

The AND gate AND12 may perform a logical AND operation on the input signals INB<2>, INB<1>, and INB<0>, and output an output signal OUT_PRE<0>. The input signal INB is an inversion signal of the input signal IN. In this embodiment of the present disclosure, the output signal OUT_PRE<0> is not used and is at a floating state.

The AND gate AND13 performs an AND operation on the input signals INB<2>, INB<1>, and IN<0>, and outputs the output signal OUT<1>. The AND gate AND14 performs an AND operation on the input signals INB<2>, IN<1>, and INB<0>, and outputs the output signal OUT<2>. The AND gate AND15 performs an AND operation on the input signals INB<2>, IN<1>, and IN<0>, and outputs the output signal OUT<3>. The AND gate AND16 performs an AND operation on the input signals IN<2>, INB<1>, and INB<0>, and outputs the output signal OUT<4>.

In addition, the AND gate AND17 performs an AND operation on the input signals IN<2>, INB<1>, and IN<0>, and outputs an output signal OUT_PRE<5>. The inverter IV3 may output a decrease signal DEC1B by inverting the decrease signal DEC1. The AND gate AND18 performs an AND operation on the output signal OUT_PRE<5> and the decrease signal DEC1B, and outputs the output signal OUT<5>.

The AND gate AND19 performs an AND operation on the input signals IN<2>, IN<1>, and INB<0>, and outputs an output signal OUT_PRE<6>. The OR gate OR3 performs an OR operation on the increase signals INC1 and INC2, and outputs an increase signal INC1_2. The AND gate AND20 performs an AND operation on the output signal OUT_PRE<6> and the increase signal INC1_2, and outputs the output signal OUT<6>.

The AND gate AND21 performs an AND operation on the input signals IN<2>, IN<1>, and IN<0>, and outputs an output signal OUT_PRE<7>. The AND gate AND22 performs an AND operation on the increase signal INC2 and the output signal OUT_PRE<7>, and outputs the output signal OUT<7>.

If the decrease signal DEC1 is deactivated to a low level and input to the decoding unit 210, the decrease signal DEC1B is output at a high level. As a result, a logic level of the output signal OUT<5> of the AND gate AND18 is determined by a logic level of the output signal OUT_PRE<5> from the AND gate AND17. When the input signals IN<2>, IN<1>, and IN<0> are set to "101," the output signal OUT_PRE<5> is output at a high level, and thus the output signal OUT<5> of the AND gate AND18 is output at a high level.

If the increase signal INC1 is activated to a high level and input to the decoding unit 210 and the increase signal INC2 is deactivated to a low level and input to the decoding unit 210, the increase signal INC1_2 is output at a high level. As a result, a logic level of the output signal OUT<6> of the AND gate AND20 is determined by a logic level of the output signal OUT_PRE<6> from the AND gate AND19. When the input signals IN<2>, IN<1>, and IN<0> are set to "110," the output signal OUT_PRE<6> is output at a high level, and thus the output signal OUT<6> of the AND gate AND20 is output at a high level.

In this embodiment, since the increase signal INC2 is deactivated to a low level and input to the decoding unit 210, the output signal OUT<7> of the AND gate AND22 is output at a low level.

The combination unit 220 may output a single output signal OUT<0> by combining the output signals OUT<7:1> from the decoding unit 210. The combination unit 220 may include an OR gate OR4 and an inverter IV4.

The OR gate OR4 may perform an OR operation on the output signals OUT<7:1>. That is, if at least one of the output signals OUT<7:1> is at a high level and input to the OR gate OR4, the OR gate OR4 outputs a high-level signal. The inverter IV4 outputs the output signal OUT<0> by inverting an output signal of the OR gate OR4.

Logic states of the decoding circuit 20 that generates 8 output signals OUT<7:0> by decoding 3 input signals IN<2:0> are shown in the following Table 2.

TABLE 2

| IN | | | OUT | | | | | | | Function |
|---|---|---|---|---|---|---|---|---|---|---|
| 2 | 1 | 0 | 7 | 6 | 5 | 4 | 3 | 2 | 1 | 0 | |
| 0 | 0 | 0 | 0 | 0 | 0 | 0 | 0 | 0 | 0 | 1 | A |
| 0 | 0 | 1 | 0 | 0 | 0 | 0 | 0 | 0 | 1 | 0 | B |
| 0 | 1 | 0 | 0 | 0 | 0 | 0 | 0 | 1 | 0 | 0 | C |
| 0 | 1 | 1 | 0 | 0 | 0 | 0 | 1 | 0 | 0 | 0 | D |
| 1 | 0 | 0 | 0 | 0 | 0 | 1 | 0 | 0 | 0 | 0 | E |
| 1 | 0 | 1 | 0 | 0 | 1 | 0 | 0 | 0 | 0 | 0 | F |
| 1 | 1 | 0 | 0 | 1 | 0 | 0 | 0 | 0 | 0 | 0 | G |
| 1 | 1 | 1 | 1 | 0 | 0 | 0 | 0 | 0 | 0 | 0 | A |

As can be seen from Table 2, if the 3-6 decoding circuit is converted into the 3-7 decoding circuit, the decoding circuit 20 outputs 7 (i.e., $2^N-1$) valid output signals OUT.

Accordingly, if the input signals IN<2:0> are set to "111," and input to the decoding unit 210, the input signals IN<2:0> must be deactivated. For this purpose, the decrease signal DEC1 and the increase signal INC2 are deactivated, and the increase signal INC1 is activated. As a result, if the input signals IN<2:0> are set to "111" and input to the decoding unit 210, the output signal OUT<7> of the AND gate AND22 is set to a low level.

If any one of the output signals OUT<6:1> is at a high level, the combination unit 220 outputs the output signal OUT<0> at a low level. In this embodiment, it is assumed that any one of the output signals OUT<6:0> is necessarily activated to a high level.

That is, a logic level of the output signal OUT<0> is determined by logic levels of the output signals OUT<6:1>. Therefore, the decoding unit 210 may output 7 valid output signals OUT<6:0> in response to 3 input signals IN<2:0>.

Figure 3:
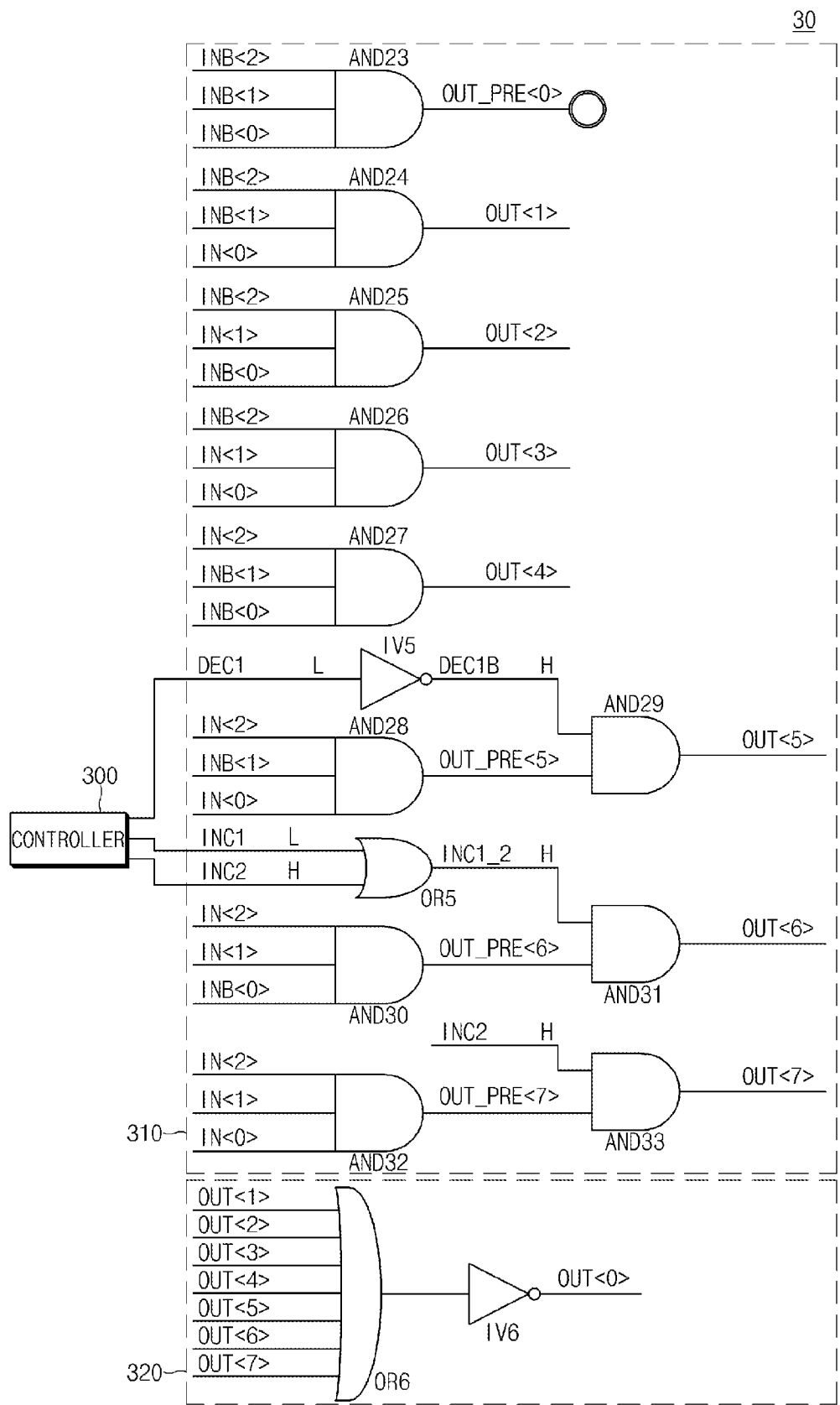
FIG. 3 is a circuit diagram illustrating a decoding circuit according to another embodiment of the present disclosure.

FIG. 3 is a circuit diagram illustrating a decoding circuit 30 according to another embodiment of the present disclosure.

The decoding circuit 30 shown in FIG. 3 can be applied to the case in which a 3-6 decoding circuit is converted into a 3-8 decoding circuit. That is, the number of valid output signals of the decoding circuit 30 is increased from 6 to 8.

In FIG. 3, the decoding circuit 30 includes a basic circuit structure configured to output 8 output signals OUT<7:0> by decoding 3 input signals IN<2:0>.

The embodiment of FIG. 3 may include a controller 300, a decoding unit 310, and a combination unit 320.

The controller 300 may generate a decrease signal DEC1 and increase signals INC1 and INC2 in response to a decoding control signal from a user. The controller 300 may separately control a logic level of the decrease signal DEC1 and logic levels of the increase signals INC1 and INC2 either using a test mode signal or through fuse cutting. As described above with reference to FIGS. 1 and 2, when the decrease signal DEC1 and the increase signals INC1 and INC2 are deactivated, i.e., at a low level, the decoding circuit 30 operates as the 3-6 decoding circuit.

In this embodiment, if the 3-6 decoding circuit is converted into the 3-8 decoding circuit, the number of valid output signals of the decoding circuit 30 is increased from 6 to 8. Therefore, the controller 300 may deactivate the decrease signal DEC1 and the increase signal INC1, and may activate the increase signal INC2.

The decoding unit 310 may include a plurality of AND gates AND23~AND33, an OR gate OR5, and an inverter IV5.

The AND gates AND23~AND27 may generate output signals OUT<4:1> of a first group. The AND gates AND28~AND33, the OR gate OR5, and the inverter IV5 may correspond to a logic combination unit configured to generate output signals OUT<7:5> of a second group.

The AND gate AND23 may perform a logic AND operation on the input signals INB<2>, INB<1>, and INB<0>, and output an output signal OUT_PRE<0>. The input signal INB is an inversion signal of the input signal IN. In this embodiment of the present disclosure, the output signal OUT_PRE<0> is not used and is at a floating state.

The AND gate AND24 performs an AND operation on the input signals INB<2>, INB<1>, and IN<0>, and outputs the output signal OUT<1>. The AND gate AND24 performs an AND operation on the input signals INB<2>, IN<1>, and INB<0>, and outputs the output signal OUT<2>. The AND gate AND26 performs an AND operation on the input signals INB<2>, IN<1>, and IN<0>, and outputs the output signal OUT<3>. The AND gate AND27 performs an AND operation on the input signals IN<2>, INB<1>, and INB<0>, and outputs the output signal OUT<4>.

In addition, the AND gate AND28 performs an AND operation on the input signals IN<2>, INB<1>, and IN<0>, and outputs an output signal OUT_PRE<5>. The inverter IV5 may output a decrease signal DEC1B by inverting the decrease signal DEC1. The AND gate AND29 performs an AND operation on the output signal OUT_PRE<5> and the decrease signal DEC1B, and outputs the output signal OUT<5>.

The AND gate AND30 performs an AND operation on the input signals IN<2>, IN<1>, and INB<0>, and outputs an output signal OUT_PRE<6>. The OR gate OR5 performs an OR operation on the increase signals INC1 and INC2, and outputs the increase signal INC1_2. The AND gate AND31 performs an AND operation on the output signal OUT_PRE<6> and the increase signal INC1_2, and outputs the output signal OUT<6>.

The AND gate AND32 performs an AND operation on the input signals IN<2>, IN<1>, and IN<0>, and outputs an output signal OUT_PRE<7>. The AND gate AND33 performs an AND operation on the increase signal INC2 and the output signal OUT_PRE<7>, and outputs the output signal OUT<7>.

If the decrease signal DEC1 is deactivated and has a low level and input to the decoding unit 310, the decrease signal DEC1B is output at a high level. As a result, a logic level of the output signal OUT<5> of the AND gate AND29 is determined by a logic level of the output signal OUT_PRE<5> from the AND gate AND28. When the input signals IN<2>, IN<1>, and IN<0> are set to "101," the output signal OUT_PRE<5> is output at a high level, and thus the output signal OUT<5> of the AND gate AND29 is output at a high level.

If the increase signal INC1 is deactivated to a low level and input to the decoding unit 310 and the increase signal INC2 is activated to a high level and input to the decoding unit 310, the increase signal INC1_2 is output at a high level. As a result, a logic level of the output signal OUT<6> of the AND gate AND31 is determined by a logic level of the output signal OUT_PRE<6> from the AND gate AND30. When the input signals IN<2>, IN<1>, and IN<0> are set to "110," the output signal OUT_PRE<6> is output at a high level, and thus the output signal OUT<6> of the AND gate AND31 is output at a high level.

In this embodiment, since the increase signal INC2 is activated to a high level and input to the decoding unit 310, a logic level of the output signal OUT<7> of the AND gate AND33 is determined by a logic level of the output signal OUT_PRE<7> from the AND gate AND32. When the input signals IN<2>, IN<1>, and IN<0> are set to "111," the output signal OUT_PRE<7> is output at a high level, and thus the output signal OUT<7> of the AND gate AND33 is output at a high level.

The combination unit 320 may output a single output signal OUT<0> by combining the output signals OUT<7:1> from the decoding unit 310. The combination unit 320 may include an OR gate OR6 and an inverter IV6.

The OR gate OR6 may perform an OR operation on the output signals OUT<7:1>. That is, if at least one of the output signals OUT<7:1> is at a high level and input to the OR gate OR6, the OR gate OR6 outputs a high-level signal. The inverter IV6 outputs the output signal OUT<0> by inverting an output signal of the OR gate OR4.

Logic states of the decoding circuit 30 that generates 8 output signals OUT<7:0> by decoding 3 input signals IN<2:0> are shown in the following Table 3.

TABLE 3

| IN | | | OUT | | | | | | | Function |
|---|---|---|---|---|---|---|---|---|---|---|
| 2 | 1 | 0 | 7 | 6 | 5 | 4 | 3 | 2 | 1 | 0 | |
| 0 | 0 | 0 | 0 | 0 | 0 | 0 | 0 | 0 | 0 | 1 | A |
| 0 | 0 | 1 | 0 | 0 | 0 | 0 | 0 | 0 | 1 | 0 | B |
| 0 | 1 | 0 | 0 | 0 | 0 | 0 | 0 | 1 | 0 | 0 | C |
| 0 | 1 | 1 | 0 | 0 | 0 | 0 | 1 | 0 | 0 | 0 | D |
| 1 | 0 | 0 | 0 | 0 | 0 | 1 | 0 | 0 | 0 | 0 | E |
| 1 | 0 | 1 | 0 | 0 | 1 | 0 | 0 | 0 | 0 | 0 | F |
| 1 | 1 | 0 | 0 | 1 | 0 | 0 | 0 | 0 | 0 | 0 | G |
| 1 | 1 | 1 | 1 | 0 | 0 | 0 | 0 | 0 | 0 | 0 | H |

As can be seen from Table 3, if the 3-6 decoding circuit is converted into the 3-8 decoding circuit, the decoding circuit 30 outputs 8 (i.e., $2^N$) valid output signals OUT.

Therefore, all the output signals are activated in response to the input signals IN<2:0>. For this purpose, the decrease signal DEC1 and the increase signal INC1 are deactivated, and the increase signal INC2 is activated to increase the number of valid output signals by two.

Subsequently, if any one of the output signals OUT<7:1> is at a high level, the combination unit 320 outputs the output signal OUT<0> at a low level. On the other hand, if all the output signals OUT<7:1> are at a low level, the combination unit 320 outputs the output signal OUT<0> at a high level. That is, the combination unit 320 may decide a logic level of the output signal OUT<0> by combination of the output signals OUT<7:1>.

In this embodiment, it is assumed that any one of the output signals OUT<7:0> is necessarily activated to a high level. Accordingly, the decoding unit 210 can output 8 valid output signals OUT<7:0> in response to 3 input signals IN<2:0>.

Figure 4:
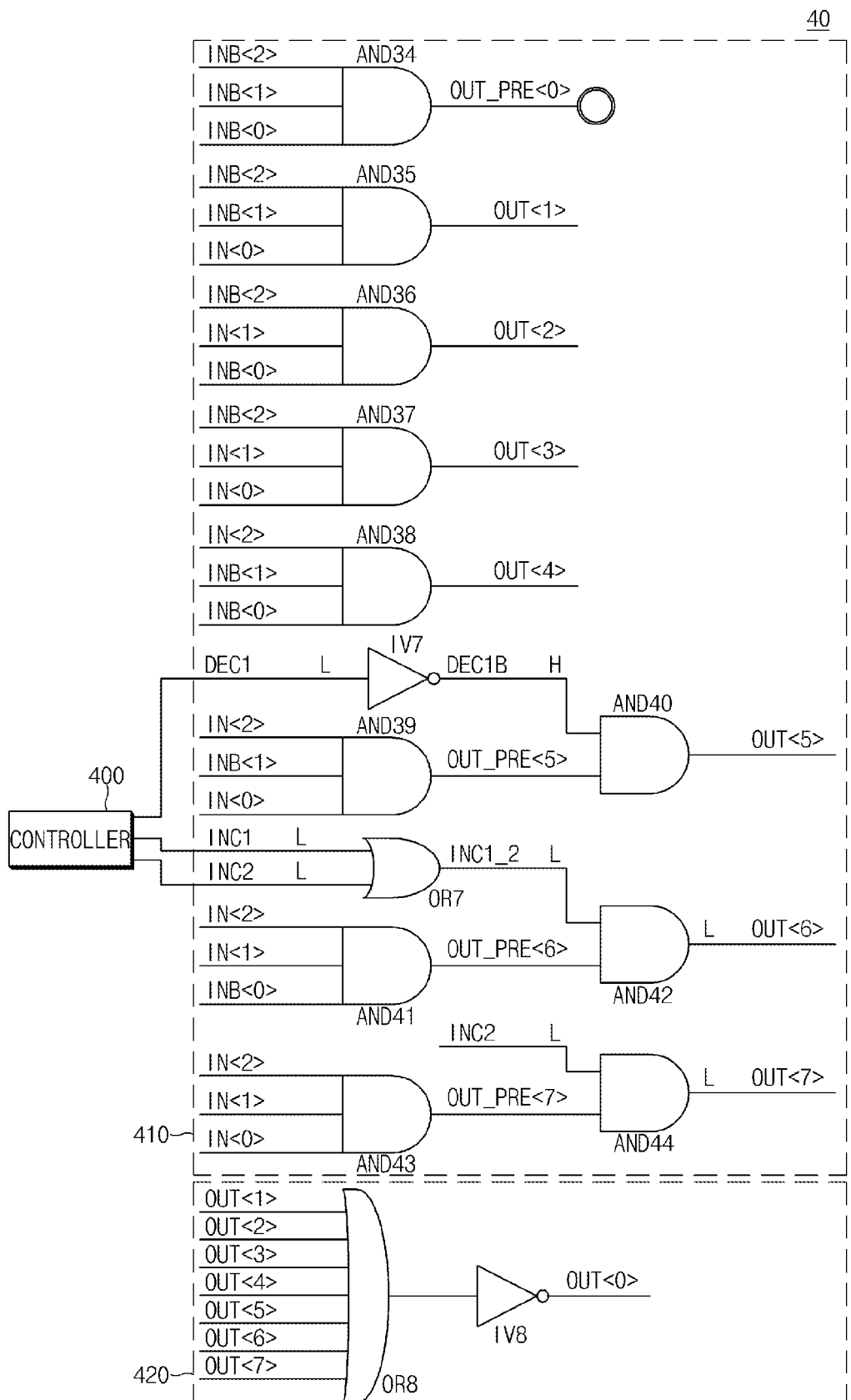
FIG. 4 is a circuit diagram illustrating a decoding circuit according to another embodiment of the present disclosure.

FIG. 4 is a circuit diagram illustrating a decoding circuit 40 according to another embodiment of the present disclosure.

FIG. 4 shows the decoding circuit 40 that operates as a 3-6 decoding circuit. That is, the number of valid output signals of the decoding circuit 40 is set to 6.

In FIG. 4, the decoding circuit 40 includes a basic circuit structure configured to output 8 output signals OUT<7:0> by decoding 3 input signals IN<2:0>.

The decoding circuit 40 includes a controller 400, a decoding unit 410, and a combination unit 420.

The controller 400 may generate a decrease signal DEC1 and increase signals INC1 and INC2 in response to a decoding control signal of a user. The controller 400 may separately control a logic level of the decrease signal DEC1 and logic levels of the increase signals INC1 and INC2 either using a test mode signal or through fuse cutting.

For example, in the case of using the 3-6 decoding circuit, it is necessary for the decoding circuit 40 to output 6 valid output signals. Therefore, the controller 400 may deactivate the decrease signal DEC1 and the increase signals INC1 and INC2.

The decoding unit 410 may include a plurality of AND gates AND34~AND44, an OR gate OR7, and an inverter IV7. The AND gates AND34~AND38 may generate output signals OUT<4:1> of a first group. The AND gates AND39~AND44, the OR gate OR7, and the inverter IV7 may correspond to a logic combination unit configured to generate output signals OUT<7:5> of a second group.

The AND gate AND34 may perform a logic AND operation on the input signals INB<2>, INB<1>, and INB<0>, and output an output signal OUT_PRE<0>. The input signal INB is an inversion signal of the input signal IN. In this embodiment of the present disclosure, the output signal OUT_PRE<0> is not used and is at a floating state.

The AND gate AND35 performs an AND operation on the input signals INB<2>, INB<1>, and IN<0>, and outputs the output signal OUT<1>. The AND gate AND36 performs an AND operation on the input signals INB<2>, IN<1>, and INB<0>, and outputs the output signal OUT<2>. The AND gate AND37 performs an AND operation on the input signals INB<2>, IN<1>, and IN<0>, and outputs the output signal OUT<3>. The AND gate AND38 performs an AND operation on the input signals IN<2>, INB<1>, and INB<0>, and outputs the output signal OUT<4>.

In addition, the AND gate AND39 performs an AND operation on the input signals IN<2>, INB<1>, and IN<0>, and outputs an output signal OUT_PRE<5>. The inverter IV7 may output a decrease signal DEC1B by inverting the decrease signal DEC1. The AND gate AND40 performs an AND operation on the output signal OUT_PRE<5> and the decrease signal DEC1B, and outputs the output signal OUT<5>.

The AND gate AND41 performs an AND operation on the input signals IN<2>, IN<1>, and INB<0>, and outputs an output signal OUT_PRE<6>. The OR gate OR7 performs an OR operation on the increase signals INC1 and INC2, and outputs an increase signal INC1_2. The AND gate AND42 performs an AND operation on the output signal OUT_PRE<6> and the increase signal INC1_2, and outputs the output signal OUT<6>.

The AND gate AND43 performs an AND operation on the input signals IN<2>, IN<1>, and IN<0>, and outputs an output signal OUT_PRE<7>. The AND gate AND44 performs an AND operation on the increase signal INC2 and the output signal OUT_PRE<7>, and outputs the output signal OUT<7>.

If the decrease signal DEC1 having a low level is input to the decoding unit 410, the decrease signal DEC1B is output at a high level. As a result, a logic level of the output signal OUT<5> of the AND gate AND40 is determined by a logic level of the output signal OUT_PRE<5> from the AND gate AND39. When the input signals IN<2>, IN<1>, and IN<0> are set to "101," the output signal OUT_PRE<5> is output at a high level, and thus the output signal OUT<5> of the AND gate AND40 is output at a high level.

If the increase signals INC1 and INC2 having a low level is input to the decoding unit 410, the increase signal INC1_2 is output at a low level. As a result, the output signal OUT<6> of the AND gate AND42 is output at a low level. If the increase signal INC2 having a low level is input to the decoding unit 410, the output signal OUT<7> of the AND gate AND44 is output at a low level.

The combination unit 420 may output a single output signal OUT<0> by combining the output signals OUT<7:1> received from the decoding unit 410. The combination unit 420 may include an OR gate OR8 and an inverter IV8.

The OR gate OR8 may perform an OR operation on the output signals OUT<7:1>. That is, if at least one of the output signals OUT<7:1> is at a high level and input to the OR gate OR8, the OR gate OR8 outputs a high-level signal. The inverter IV8 outputs the output signal OUT<0> by inverting an output signal of the OR gate OR8.

Logic states of the decoding circuit 40 that generates 6 valid output signals OUT<5:0> by decoding 3 input signals IN<2:0> are shown in the following Table 4.

TABLE 4

| IN | | | OUT | | | | | | | Function |
|---|---|---|---|---|---|---|---|---|---|---|
| 2 | 1 | 0 | 7 | 6 | 5 | 4 | 3 | 2 | 1 | 0 | |
| 0 | 0 | 0 | 0 | 0 | 0 | 0 | 0 | 0 | 0 | 1 | A |
| 0 | 0 | 1 | 0 | 0 | 0 | 0 | 0 | 0 | 1 | 0 | B |
| 0 | 1 | 0 | 0 | 0 | 0 | 0 | 0 | 1 | 0 | 0 | C |
| 0 | 1 | 1 | 0 | 0 | 0 | 0 | 1 | 0 | 0 | 0 | D |
| 1 | 0 | 0 | 0 | 0 | 0 | 1 | 0 | 0 | 0 | 0 | E |
| 1 | 0 | 1 | 0 | 0 | 1 | 0 | 0 | 0 | 0 | 0 | F |
| 1 | 1 | 0 | 0 | 1 | 0 | 0 | 0 | 0 | 0 | 0 | A |
| 1 | 1 | 1 | 1 | 0 | 0 | 0 | 0 | 0 | 0 | 0 | A |

As can be seen from Table 4, in the case of using the 3-6 decoding circuit, the decoding circuit 40 outputs only 6 (i.e., $2^N-2$) valid output signals OUT.

Accordingly, if a bit value of the input signals IN<2:0> is set to "110" and "111" and input to the decoding unit 410, the input signals IN<2:0> must be deactivated. For this purpose, the decrease signal DEC1 is deactivated, and the increase signals INC1 and INC2 are deactivated. As a result, if the bit value of the input signals IN<2:0> are set to "110" and "111" and input to the decoding unit 410, the output signals OUT<7:6> of the AND gates AND42 and AND44 are set to a low level.

If any one of the output signals OUT<5:1> is at a high level, the combination unit 420 outputs the output signal OUT<0> at a low level. In this embodiment, it is assumed that any one of the output signals OUT<5:0> is necessarily activated to a high level.

That is, a logic level of the output signal OUT<0> is determined by a level of the output signal OUT<5:1>. As a result, the decoding unit 410 outputs 6 output signals OUT<5:0> in response to 3 input signals IN<2:0>.

Figure 5:
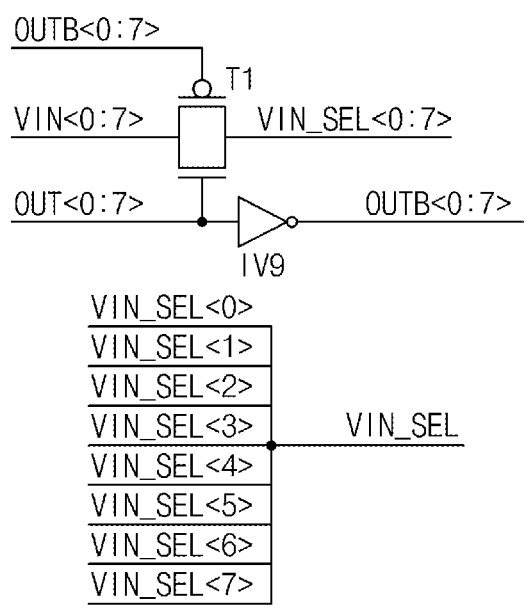
FIG. 5 is a circuit diagram illustrating a selection circuit according to an embodiment of the present disclosure.

FIG. 5 is a circuit diagram illustrating a selection circuit 50 according to an embodiment of the present disclosure.

The selection circuit 50 shows the case in which 8 output signals are selected and output using a 3-8 decoding circuit.

For this purpose, the selection circuit 50 includes a transfer gate T1 and an inverter IV9. The transfer gate T1 may select input signals VIN<0:7> in response to output signals OUT<0:7> and OUTB<0:7> of a decoding circuit, and thus output selection signals VIN_SEL<0:7>. The output signals OUTB<0:7> are obtained by inverting the output signals OUT<0:7> using the inverter IV9.

If the output signals OUT<0:7> of the decoding circuit transition to a high level, the transfer gate T1 is turned on and the input signals VIN<0:7> are selected, so that the selection signals VIN_SEL<0:7> are output. The 8 selection signals VIN_SEL<0:7> are combined so that a single selection signal VIN_SEL is output.

As described above, if it is desired that the selection circuit 50 outputs the 8 selection signals VIN_SEL<0:7>, the 3-8 decoding circuit outputting the 8 valid output signals OUT<0:7> is used.

The selection circuit 50 can also be applied to the case in which 6 output signals are selected and output using the 3-6 decoding circuit, without changing a circuit structure.

In other words, the number of valid output signals of the 3-6 decoding circuit is set to 6. That is, if the selection circuit 50 desires to output 6 selection signals VIN_SEL<0:5>, the 3-6 decoding circuit outputting 6 output signals OUT<0:5> is used. In this case, the output signals OUT<6:7> of the decoding circuit are output at a low level in response to the control signals DEC1, INC1, and INC2.

Therefore, the selection circuit 50 can be used with the 3-5, 3-6, 3-7, or 3-8 decoding circuit without changing the circuit structure. In more detail, in the case of using the decoding circuits shown in FIGS. 1 to 4, the number of valid output signals OUT can be adjusted by controlling the output signals DEC1, INC1, and INC2 of the controllers 100-400 without changing the circuit structures of the decoding circuits and the selection circuit.

Conventionally, if the 3-6 decoding circuit is changed to the 3-7 or 3-8 decoding circuit, a system designer must redesign or reconfigure a necessary circuit, resulting in greater inconvenience of use. However, according to the embodiments, the number of valid output signals of the decoding circuit can be adjusted in response to control signals of the controllers 100, 200, 300, or 400 without modifying the circuit design.

Specifically, the largest decoding circuit (e.g., the 3-8 decoding circuit) from among the decoders corresponding to the embodiments is set to a basic circuit structure, and may be changed to the 3-6 decoding circuit. In addition, in the case of using the 3-6 decoding circuit as a basic circuit, the number of output signals of the decoding circuit may be changed according to the decrease signal DEC1 and the increase signals (INC1, INC2).

The embodiments of the present disclosure can be applied not only to semiconductor memory devices, such as DRAM, SRAM, FLASH memories, etc., but also to any of semiconductor devices having signals to be decoded.

As is apparent from the above description, the decoding circuit according to the embodiments can adjust the number of valid output signals without changing its circuit structure.

Those skilled in the art will appreciate that embodiments of the present disclosure may be carried out in other specific ways than those set forth herein without departing from the spirit and essential characteristics of the present disclosure. The above embodiments are therefore to be construed in all aspects as illustrative and not restrictive.

The scope of the present disclosure should be determined by the appended claims and their legal equivalents, not by the above description. Further, all changes coming within the meaning and equivalency range of the appended claims are intended to be embraced therein. In addition, it will be obvious to those skilled in the art that claims that are not explicitly cited in each other in the appended claims may be presented in combination as an embodiment of the present disclosure or included as a new claim by a subsequent amendment after the application is filed.

Although a number of illustrative embodiments have been described, it should be understood that numerous other modifications and embodiments can be devised by those skilled in the art that will fall within the spirit and scope of the principles of the present disclosure. Particularly, numerous variations and modifications are possible in the component parts and/or arrangements which are within the scope of the present disclosure, the drawings and the accompanying claims. In addition to variations and modifications in the component parts and/or arrangements, alternative uses will also be apparent to those skilled in the art.

What is claimed is:

1. A decoding circuit, comprising:
a controller configured to generate control signals;
a decoding unit configured to generate output signals corresponding to elements of $2^N$ binary information by decoding N input signals, N being a positive integer, wherein the number of output signals is controlled in response to the control signals; and
a combination unit configured to output a first output signal by combining the output signals of the decoding unit,
wherein the decoding circuit outputs, as decoded output signals, the first output signal of the combination unit and the output signals of the decoding unit.

2. The decoding circuit according to claim 1, wherein the controller generates the control signals including a decrease signal for reducing the number of output signals, a first increase signal for increasing the number of output signals by one, and a second increase signal for increasing the number of output signals by two.

3. The decoding circuit according to claim 1, wherein the controller controls logic levels of the control signals using at least one of a test mode signal and a fuse-cutting signal.

4. The decoding circuit according to claim 1, wherein the decoding circuit includes a basic circuit structure to implement a 3-8 decoding circuit configured to output 8 decoded output signals by decoding 3 input signals.

5. The decoding circuit according to claim 1, wherein the decoding circuit is configured to output $2^N-3$ decoded output signals when a decrease signal from among the control signals is activated.

6. The decoding circuit according to claim 1, wherein the decoding circuit outputs $2^N-1$ decoded output signals when a first increase signal from among the control signals is activated, and outputs $2^N$ decoded output signals when a second increase signal from among the control signals is activated.

7. The decoding circuit according to claim 1, wherein the decoding circuit outputs $2^N-2$ decoded output signals when the control signals are deactivated.

8. The decoding circuit according to claim 1, further comprising a selection circuit configured to output a selection signal in response to the decoded output signals,
wherein the selection circuit outputs the selection signal without changing a circuit structure thereof, even if the number of output signals is changed.

9. The decoding circuit according to claim 1, wherein the decoding unit includes:
a plurality of AND gates configured to generate output signals of a first group by decoding the N input signals; and
a logic combination unit configured to generate output signals of a second group by decoding the N input signals in response to the control signals.

10. The decoding circuit according to claim 9, wherein N is 3 and the plurality of AND gates is configured to output second to fifth output signals included in the output signals generated by the decoding unit.

11. The decoding circuit according to claim 10, wherein the logic combination unit includes:
a first AND gate configured to perform an AND operation on the N input signals;
a second AND gate configured to output a sixth output signal by performing an AND operation on an inversion signal of a decrease signal from among the control signals and an output signal of the first AND gate;
a first OR gate configured to perform an OR operation on a first increase signal and a second increase signal from among the control signals;
a third AND gate configured to perform an AND operation on the N input signals;
a fourth AND gate configured to output a seventh output signal by performing an AND operation on an output signal of the first OR gate and an output signal of the third AND gate;
a fifth AND gate configured to perform an AND operation on the N input signals; and
a sixth AND gate configured to output an eighth output signal by performing an AND operation on an output signal of the fifth AND gate and the second increase signal from among the control signals, and to output an $8^{th}$ output signal.

12. The decoding circuit according to claim 9, wherein at least one of the first output signal and the output signals of the first group is output at a high level.

13. The decoding circuit according to claim 9, wherein:
when each of the output signals of the second group are at a low level, the combination unit is configured to determine a logic level of the first output signal in response to logic levels of the output signals of the first group.

14. The decoding circuit according to claim 9, wherein:
if any one of the output signals of the first group is at a high level when each of the output signals of the second group are at a low level, the combination unit is configured to output the first output signal at a low level.

15. The decoding circuit according to claim 9, wherein:
if each of the output signals of the first group are at a low level when each of the output signals of the second group are at a low level, the combination unit is configured to output the first output signal at a high level.

16. The decoding circuit according to claim 1, wherein the combination unit includes:
an OR gate configured to perform an OR operation on the output signals of the decoding unit; and
an inverter configured to output the first output signal by inverting an output signal of the OR gate.

17. The decoding circuit according to claim 1, wherein the decoding circuit is used as a 3-5 decoding circuit that decodes 3 input signals and outputs 5 decoded output signals when a decrease signal from among the control signals is activated.

18. The decoding circuit according to claim 1, wherein the decoding circuit is used as a 3-7 decoding circuit that decodes 3 input signals and outputs 7 decoded output signals when a first increase signal from among the control signals is activated.

19. The decoding circuit according to claim 1, wherein the decoding circuit is used as a 3-8 decoding circuit that decodes 3 input signals and outputs 8 decoded output signals when a second increase signal from among the control signals is activated.

20. The decoding circuit according to claim 1, wherein the combination unit is configured to control the logic level of the first output signal by logically combining the output signals of the decoding unit.

* * * * *